United States Patent [19]

Kaufman

[11] Patent Number: 5,630,415

[45] Date of Patent: May 20, 1997

[54] RIGIDIZED GRADIENT COIL

[75] Inventor: Leon Kaufman, San Francisco, Calif.

[73] Assignee: The Regents of the University of California, Berkeley, Calif.

[21] Appl. No.: 374,882

[22] Filed: Jan. 19, 1995

[51] Int. Cl.$^6$ ................................................. G01R 33/20
[52] U.S. Cl. ........................ 128/653.2; 600/13; 324/318; 128/653.5
[58] Field of Search .......................... 128/653.2, 653.5; 600/13; 324/318, 320, 322, 309

[56] References Cited

U.S. PATENT DOCUMENTS

| | | |
|---|---|---|
| 4,639,672 | 1/1987 | Beaumont . |
| 4,893,083 | 1/1990 | Overweg et al. . |
| 5,084,676 | 1/1992 | Saho et al. . |
| 5,235,283 | 8/1993 | Lehne et al. . |
| 5,256,969 | 10/1993 | Miyajima et al. . |
| 5,332,972 | 7/1994 | Takenouchi . |

FOREIGN PATENT DOCUMENTS

WO91/19209A1  12/1991  WIPO .

OTHER PUBLICATIONS

Galbraith, J., "Composite Isogrid," Special Technology Applications Review, Phillips Laboratory, Kirtland AFB, Albuquerque, New Mexico, Nov. 4–5, 1993, pp. 6–7.

Primary Examiner—Marvin M. Lateef
Assistant Examiner—Shawra J. Shaw
Attorney, Agent, or Firm—Nixon & Vanderhye P.C.

[57] ABSTRACT

A gradient coil assembly for a magnetic resonance imaging device is disclosed. The gradient coil assembly includes a web of interconnected fibs fixed to the gradient coil former to rigidize the gradient coil former. The rigidized gradient coil former is less susceptible to vibration, thus minimizing the acoustical noise generated by the gradient coil assembly during the MRI operation.

45 Claims, 6 Drawing Sheets

RIGIDIZED GRADIENT COIL

FIELD OF THE INVENTION

This invention relates to magnetic resonance imaging (MRI). More particularly, this invention relates to the electromagnetic coil structure used in an MRI system for creating transverse magnetic gradients in a static magnetic field.

BACKGROUND OF THE INVENTION

In most MRI systems, a static magnet (for example, a superconducting solenoid) creates a substantially homogeneous nominally static magnetic field within a region to be imaged. The static magnetic field (and consequently the imaging area) may be within a cylindrical enclosure with the static magnet coiled around the cylinder or may be in an open access type environment where the static magnets are plate-like and on opposite sides of the imaging area.

The different types of MRI structures also use electromagnetic gradient coils near the static magnet structure. When proper electrical currents are passed through these gradient coils, the nominally static homogeneous field in the imaging area may be temporarily altered to produce a controlled gradient magnetic field in any of three orthogonal coordinate directions. The magnetic gradient coils generally take a shape similar to the static magnet pieces; that is, with plate-like static magnet pieces, the gradient coils are also plate-like and with cylindrical static magnet coils, the gradient coils are also cylindrical. Generally, in both the plate-like and cylindrical embodiments, three electromagnetic gradient coils (one for each of the three orthogonal directions X, Y, and Z) are provided as a series of conductive windings on or in a gradient coil former. During the MRI procedure, currents are rapidly applied and removed from these various gradient coils to create the requisite gradient magnetic fields. The rapid switching of current in the conductive windings of the gradient coils creates forces which manifest themselves as bending moments on the gradient coils and the formers around them. Each time the respective gradient coils are energized by applying the input current, the gradient coil former deforms, and each time the current is removed, the gradient coil former at least partially relaxes. This deformation and relaxation that occurs each cycle that a gradient coil is energized results in a continuous acoustical string of noise bursts within the imaging area.

During the MRI procedure, these energizing cycles occur rapidly and repetitively thus causing the gradient coil former to vibrate like the diaphragm of an acoustic speaker. Like in the speaker, the vibrations in the MRI gradient coil former generate acoustic noise, and in the case of the MRI system, this acoustic noise can be quite loud and unpleasant for the human within the imaging area.

SUMMARY OF THE INVENTION

The unpleasant noise in the MRI imaging area can be reduced by rigidizing the gradient coil former. When the gradient coil former is more rigid, it will better oppose the deflection force caused by the gradient coils, and consequently will generate less acoustic noise in the imaging area.

In a preferred embodiment of the present invention the gradient coil former is rigidized by a grid having a hexagonal web of ribs formed integrally with the gradient coil former. The gradient coil former may be further rigidized by adding a skin of fiberglass epoxy laminate to the hexagonal grid such that the grid transfers forces between the skin and the gradient coil former in such a way that when the former attempts to bend, the former and the skin are subjected to compressive or tensile forces in a direction generally along their surface planes. Since the skin and the gradient coil former will tend to oppose the compressive or tensile forces, the grid effectively rigidizes the gradient coil former without adding excessive weight to the assembly.

These and other advantages of the invention will be more completely understood and appreciated by carefully reading the following detailed description of the presently preferred exemplary embodiment of this invention when taken in conjunction with the accompanying drawings, of which:

DETAILED DESCRIPTION OF THE PRESENTLY PREFERRED EMBODIMENTS

In general, MRI systems include static magnets which provide a nominally static homogeneous magnetic field in an image area, gradient coils to alter the static magnet field in a particular direction, and RF transmission and reception coils to induce and receive RF transmissions generated by certain hydrogen nuclei in the human body. The present invention relates particularly to the structure of the gradient coils and their associated assemblies.

Figure 1:
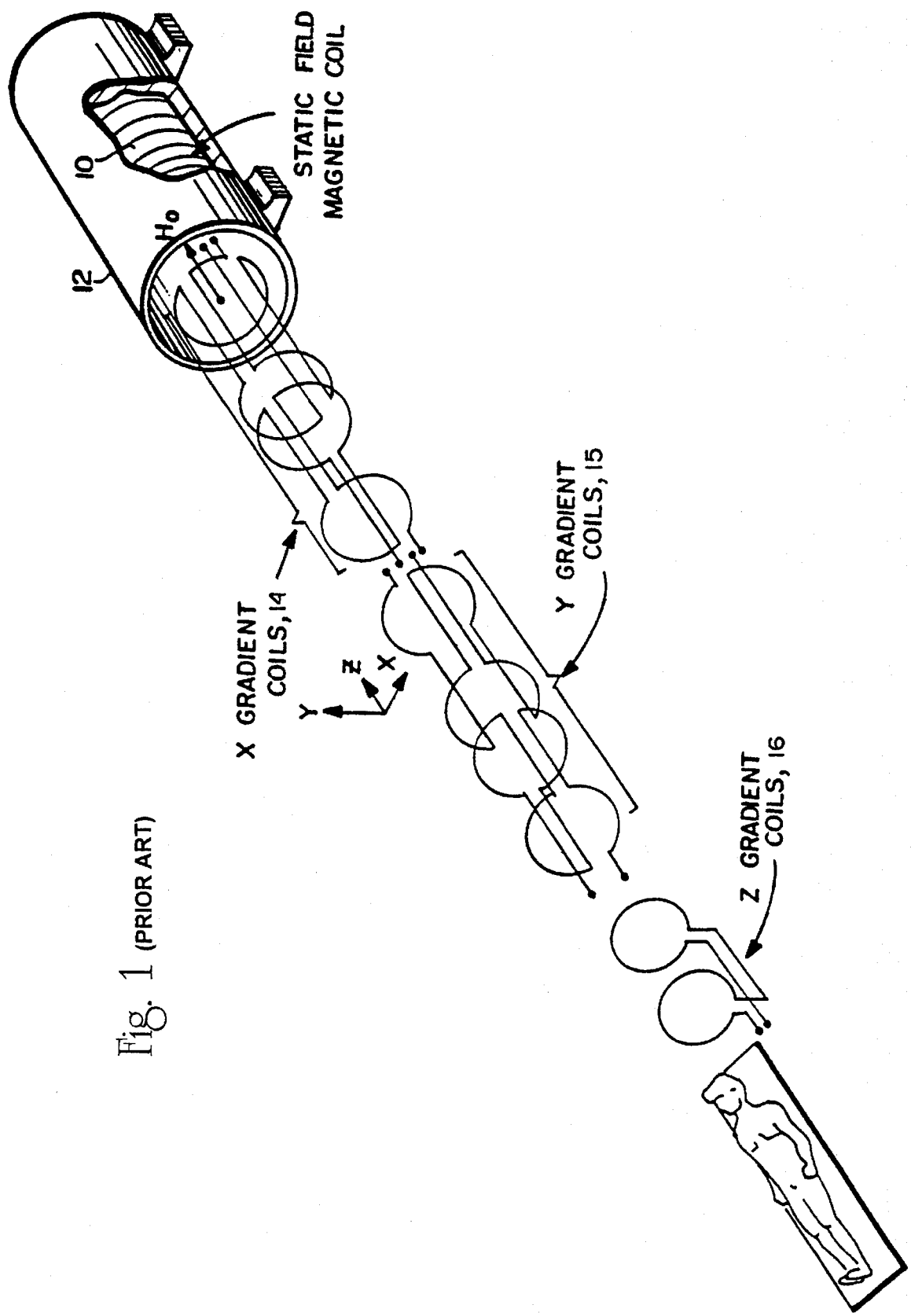
FIG. 1 is an MRI assembly with cylindrical gradient coils.

Two common types of gradient coils are 1) cylindrical gradient coils (also referred to as saddle coils) and 2) planar gradient coils (also referred to as plate coils). Typical cylindrical gradient coils that induce gradient magnetic fields, in respectively, the X, Y, and Z directions are shown in FIG. 1. Specifically, the X gradient coils 14, Y gradient coils 15, and Z gradient coils 16 are shown expanded from the static magnet coil 10 and MRI cylindrical housing 12 of the MRI system. In operation, the X gradient coils 14, Y gradient coils 15, and Z gradient coils 16 are nested together into a single cylindrical unit and are attached to or formed in a gradient coil former that gives the gradient coils greater mechanical structure. The gradient coils and associated gradient coil former form a single cylindrical unit which fits within the interior of the static magnet coil 10 and cylindrical MRI housing 12.

Figure 2:
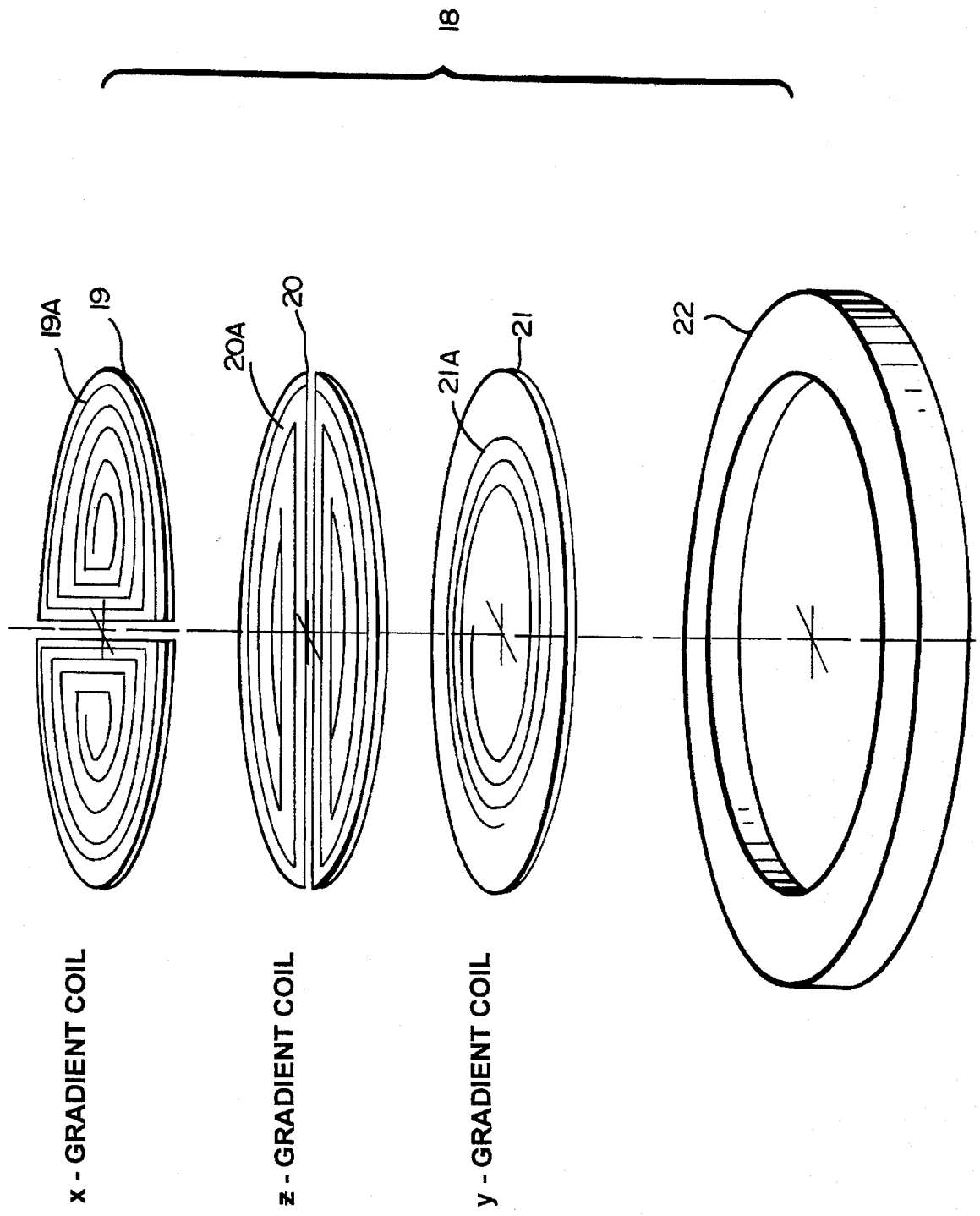
FIG. 2 is an isometric view of substantially planar gradient coils.

An alternative structure for the gradient coils is shown in FIG. 2. In FIG. 2, the X gradient coil 19, Z gradient coil 20, and Y gradient coil 21 include conductive windings 19A, 20A, and 21A formed in or on former plates, which are nested one on top of the other within the shim 22. The entire assembly of gradient coils 19–21 and shim 22 may be referred to as the gradient coil former 18. Although the X gradient coil 19, Z gradient coil 20, and Y gradient coil 21 and shim 22 are shown as separate units in FIG. 2, they may instead be formed as one integral plate-like unit.

Figure 3:
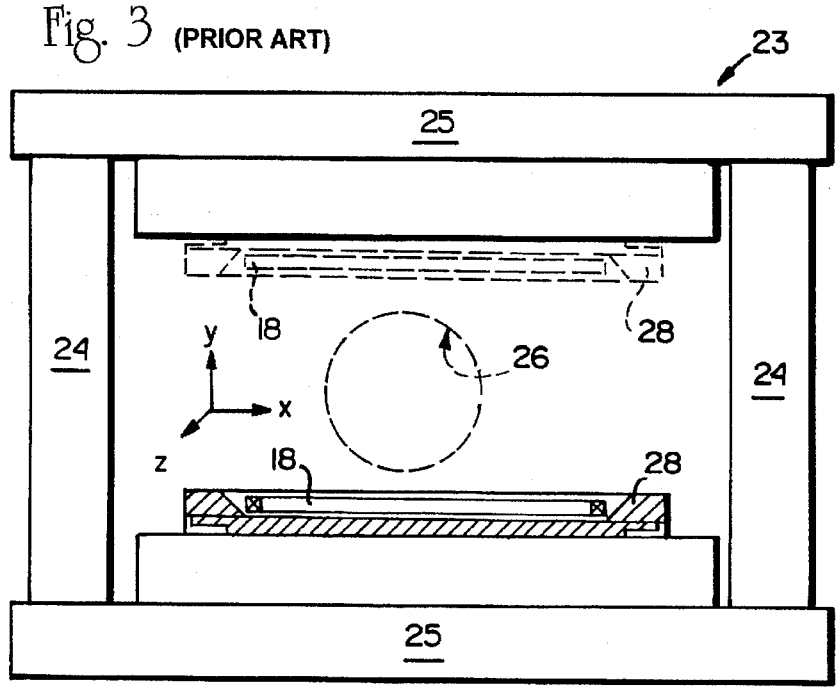
FIG. 3 is a front view of a open access MRI assembly using the substantially planar coils of FIG. 2.

The plate-like gradient coil former 18 is shown in an open access MRI system 23 in FIG. 3. The open access MRI system 23 may be a so-called four post system such as is shown in FIG. 3 where posts 24 support upper and lower magnet assemblies 25, respectively above and below and image area 26. Near the image area 26, plate-like gradient coil assemblies 18 are positioned near pole tips 28.

A predominant complaint of patients within the cylindrical and sometimes open access MRI systems is the relatively loud acoustical noise that is generated by the MRI system. As discussed above, the noise is caused by the operation of the gradient coil assemblies and specifically by current rapidly applied and removed from the various gradient coils, causing the coil former to deflect.

The present invention lessens the volume of the acoustical noise in the imaging area by improving the rigidity of the gradient coil former that supports the gradient coils. The present gradient coil former better resists the deformation forces induced on it when the various gradient coils are energized, thereby lessening the vibration of the gradient coil former and lessening the noise caused by the vibration.

Figure 4:
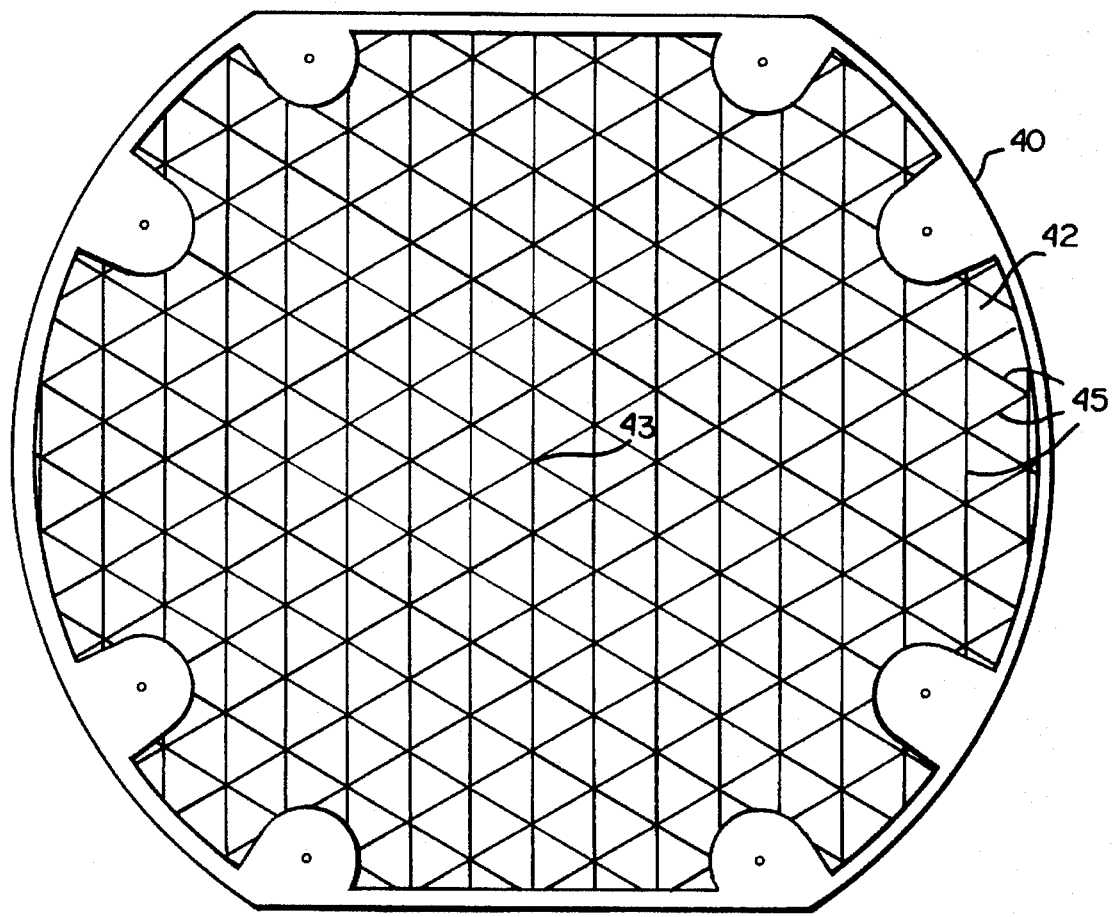
FIG. 4 is a top view of an exemplary embodiment of the present grid.

The preferred embodiment of the present invention includes an epoxy grid, such as is shown in FIG. 4, integral with the gradient coil former to improve the rigidity of the gradient coil former. This assembly lessens the acoustical noise in the imaging area without adding excessive weight to the gradient coil assembly.

Figure 5:
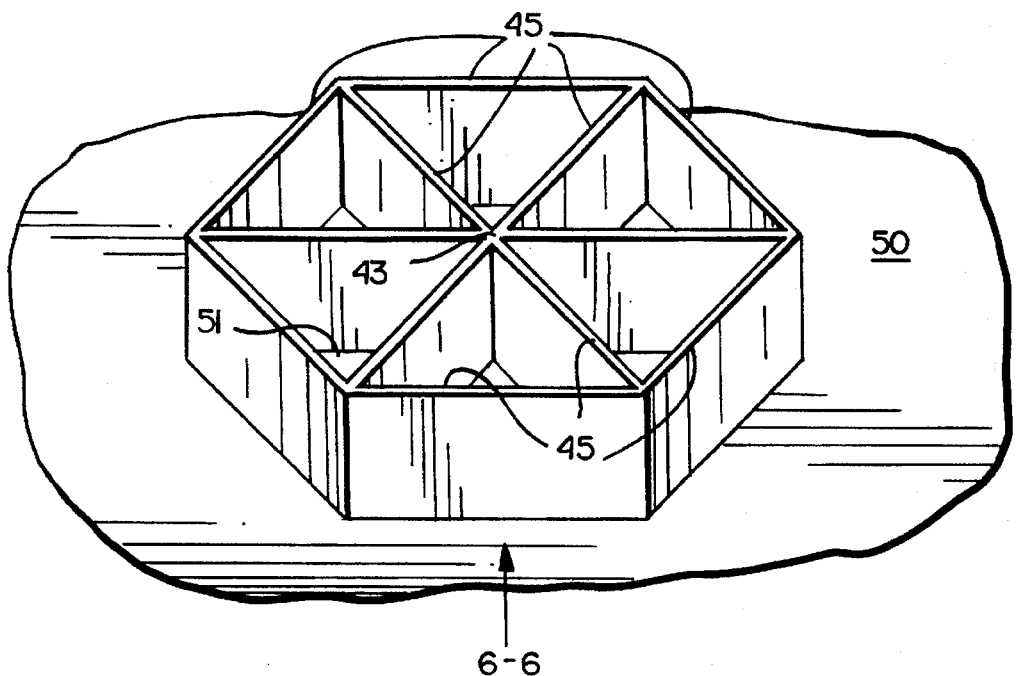
FIG. 5 is an isometric view of one hexagonal cell of the grid of FIG. 4.

In the embodiment of FIG. 4, the grid 40 is molded integrally with the gradient coil former and includes a web 42 made up of a plurality of ribs 45 which interconnect with each other to form a geometric hexagonal pattern. The interconnection of this web 42 with the gradient coil former of, for example FIG. 2, is more particularly shown in FIG. 5. Specifically, in FIG. 5, the hexagonal cell that surrounds the point 43 in FIG. 4 is shown in isometric view in FIG. 5. In FIG. 5, the ribs 45 are epoxy walls about 1" in height that interconnect with each other to form a hexagonal shape composed of six equilateral triangles.

Figure 6:
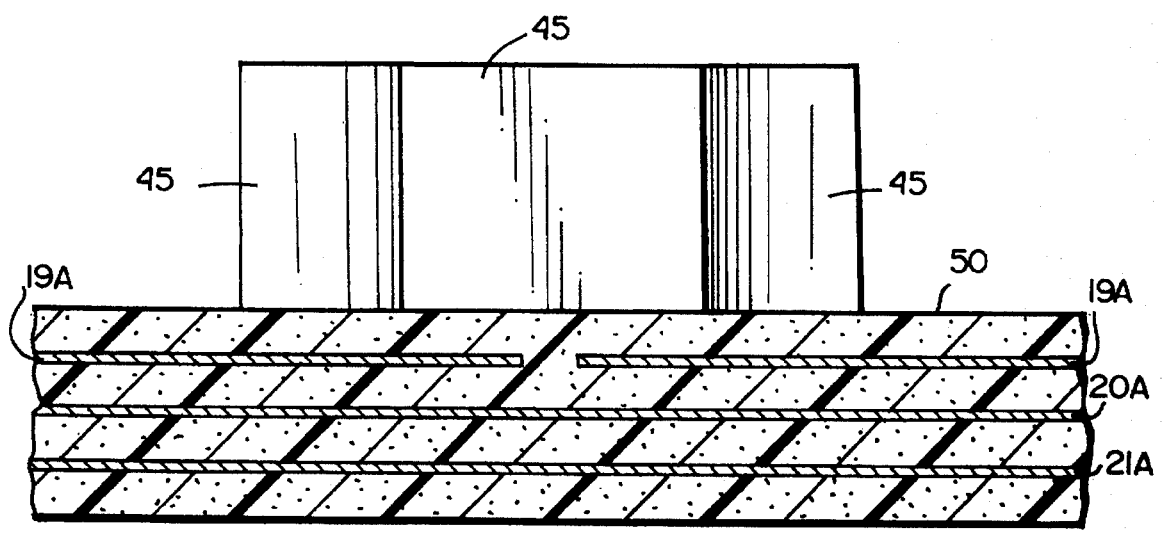
FIG. 6 is a front view of the cell of FIG. 5.

As shown in FIG. 6, the gradient coil wires 19A, 20A, and 21A (see FIG. 2), the gradient coil former 50, and the fibs 45 of the web 42 are formed integrally into a coherent mechanical structure. One method of accomplishing this is to prepare an aluminum mold into which the gradient coil wires 19A–21A are placed. In the preferred embodiment, the aluminum mold includes a lower portion which will form the gradient coil former and an upper portion which will form the grid. The mold is filled with epoxy resin to envelope the wires 19A–21A in the lower portion of the mold and to form the hexagonal web 42 in the upper portion of the mold. When the epoxy sets, the complete gradient coil assembly, including the wires 19A–21A, the web 42, and the gradient coil former 50 are removed from the mold as a single mechanically contiguous unit, such as is shown in FIG. 6.

Figure 7:
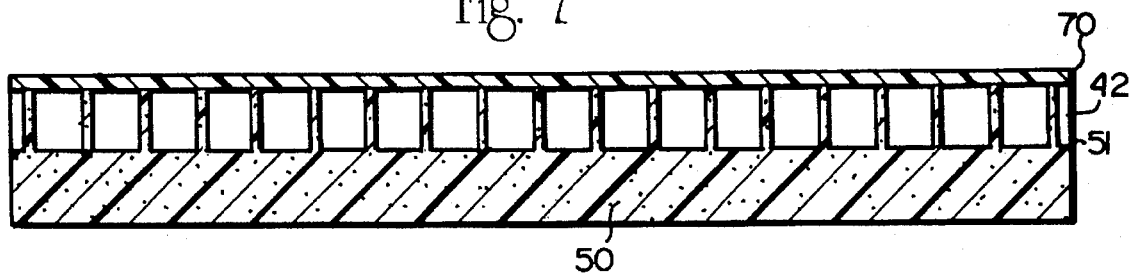
FIG. 7 is a side cross-sectional view of one embodiment of the present invention.
Figure 8:
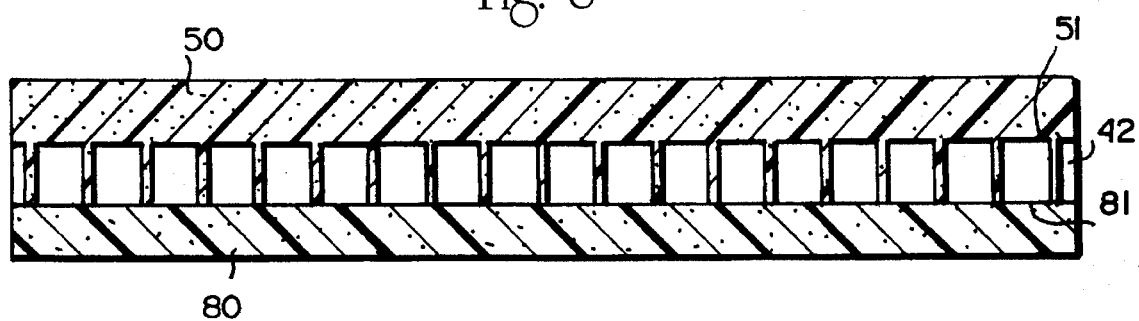
FIG. 8 is a side cross-sectional view of another embodiment of the present invention.
Figure 9:
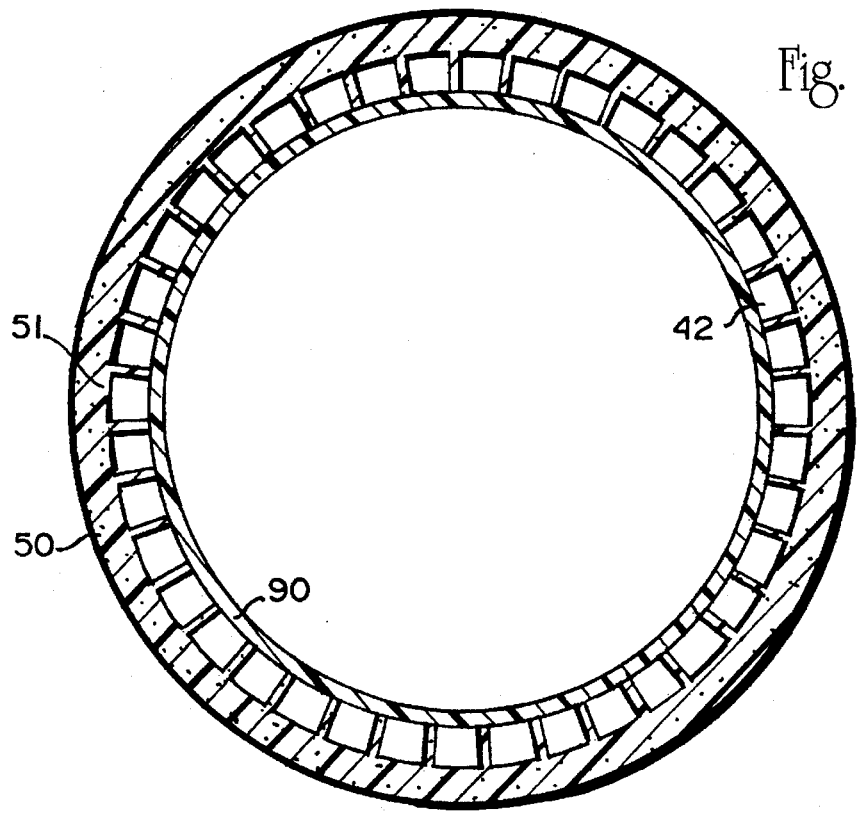
FIG. 9 is a side cross-sectional view of still another embodiment of the present invention.
Figure 10:
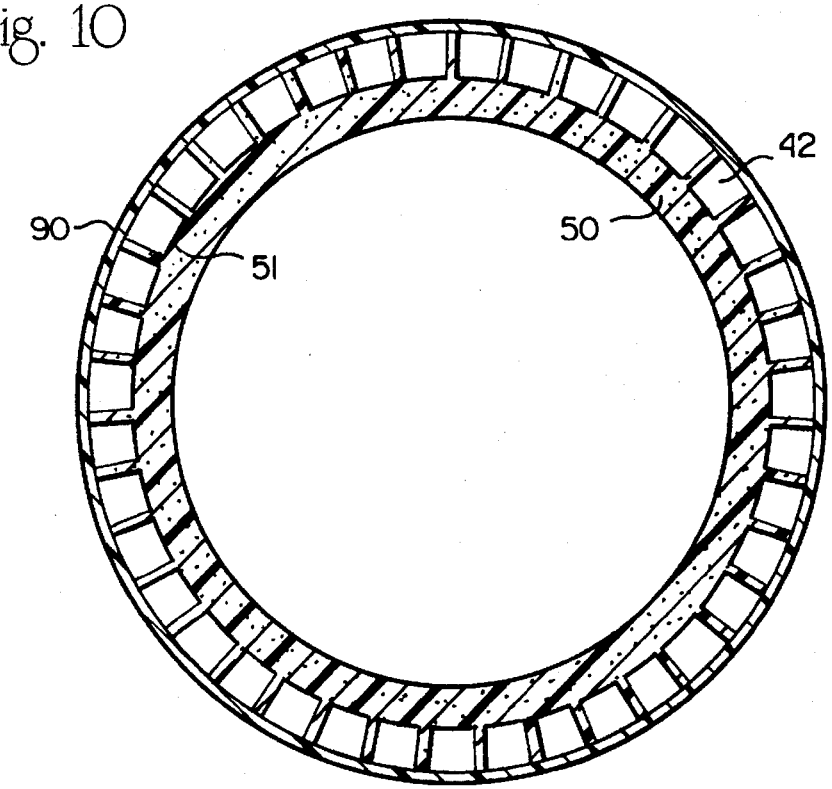
FIG. 10 is a side cross-sectional view of still another embodiment of the present invention.
Figure 11:
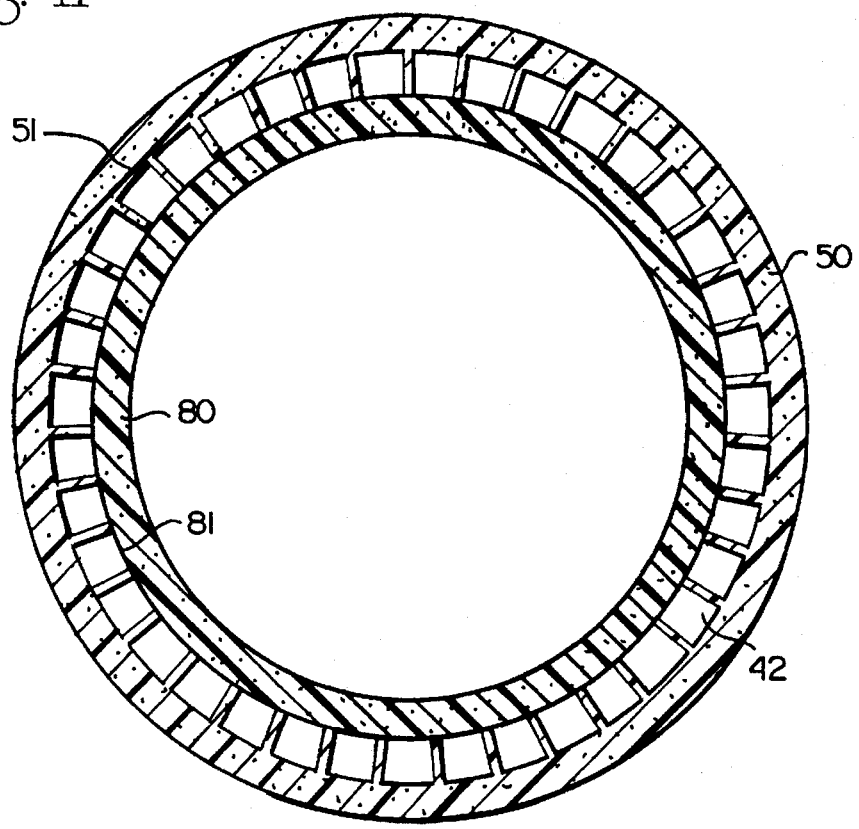
FIG. 11 is a side cross-sectional view of still another embodiment of the present invention.

FIGS. 7–11 are cross-sectional views of various gradient coil assembly embodiments of the present invention. FIGS. 7 and 8 show two plate coil embodiments of the invention for use in open access MRI systems such as are shown in FIGS. 2 and 3. FIGS. 9–11 show cylindrical coil embodiments of the present invention for use in cylindrical MRIs such as is shown in FIG. 1.

In FIG. 7, the coil former 50 is shown integral with the web 42 to form a plate gradient coil assembly. The gradient coil wires 19A–21A would ordinarily be seen in former 50 of FIG. 7 (as are similarly shown in FIG. 6), but are omitted from FIGS. 7–11 for clarity. In FIG. 7, the web 42/coil former 50 assembly is made as a single epoxy unit in the aluminum mold as described above. Afterward, a skin 70 of fiberglass epoxy laminate (such as is marketed as "G10" or "FRP" board) is epoxyed to the web 42 opposite the coil former 50. With the embodiment shown in FIG. 7, as the gradient coils embedded in the coil former 50 attempt to deform the coil former 50 during the MRI operation, the web 42 will transfer the deformation forces between the skin 70 and the adjoining surface 51 of the coil former 50 so as to subject the skin and surface to compressive or tensile forces. The skin 70 and surface 51 will resist the compressive or tensile forces, thus resisting the defamation of the coil former 50 and effectively rigidizing the gradient coil assembly.

FIG. 8 shows another embodiment in which the gradient coil assembly includes a gradient coil former 50, a web 42 integral with the gradient coil former 50, and a gradient coil shield 80 attached by epoxy resin to the web 42. The embodiment of FIG. 8 is similar to that shown in FIG. 7, except for the inclusion of the gradient coil shield in the embodiment of FIG. 8. The gradient coil shield is a standard part of MRI devices for decoupling the gradient coil wires from the RF transmitter and receiver coils. In the embodiment of FIG. 8, the shield 80 is preferably separately molded and then epoxyed to the web 42. Alternatively, the shield 80 may be formed integrally with the web 42 in an aluminum mold similar to the epoxy molding process described above. In FIG. 8, the surface 81 of the gradient coil shield 80 eliminates the need for a skin 70 since the surface 81 will resist the compressive and tensile forces applied to the web 42.

In FIG. 9, the web 42 is in the shape of a circular cylinder and is sandwiched between the gradient coil former 50 and a skin 90. Like the embodiment shown in FIG. 7, the circular embodiment of FIG. 9 may be manufactured by filling an aluminum mold with epoxy resin to form the coil former 50 and web 42 into a single mechanically coherent unit and then epoxying the circular cylinder skin 90 onto the interior surface of the web 42.

The embodiment of FIG. 10 is like that of FIG. 9, except the cylindrical gradient coil assembly includes a gradient coil former 50 on the interior of the circular cylinder, and a skin 90 on the exterior of the circular cylinder. Web 42 is sandwiched between the former 50 and the skin 90 to improve rigidity.

In FIG. 11, a gradient coil shield 80 is included in the circular cylinder gradient coil assembly. The web 42 is, like the embodiment of FIG. 8 (for the plate embodiment), sandwiched between the gradient coil former 50 and the gradient coil shield 80 at their respective surfaces 51 and 81.

While the present invention has been described with respect to two MRI environments, namely the plate-like environment and the right circular cylinder embodiment, the present invention may be practiced in other types and shapes of gradient coil assemblies including oval cylindrical gradient coil assemblies, curved plate-like assemblies, etc. As used in this specification and in the appended claims, the term "cylindrical" shall mean all closed-loop forms including circular cylinders, oval cylinders, and irregular cylinders. The term "plate" and "plate-like" shall include planar plates, concave and convex plates, and irregular plates. The term "fixed" shall mean any method of mechanically attaching one component to another, including without limitation, forming the components integrally with each other, bonding them with epoxy or other suitable substance; gluing them; screwing, nailing or pegging them; bonding them by heating or dissolving their common surfaces; etc.

The present invention also is not limited to a web of ribs having any particular geometric or non-geometric pattern, but includes webs having walls of any pattern or randomness suitable for reducing acoustic noise caused by deflection in the gradient coil former.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An MRI gradient coil assembly, comprising:
   at least one gradient coil to induce a gradient magnetic field in an imaging area;
   a gradient coil former fixed to the gradient coil;
   a grid fixed to the gradient coil former, the grid having a plurality of interconnected ribs forming a web wherein the grid opposes elastic deformation of the gradient coil former induced by operation of the gradient coil; and
   a skin fixed to the grid opposite the gradient coil former.

2. An MRI gradient coil assembly according to claim 1, wherein the ribs form a web of geometric shapes.

3. An MRI gradient coil assembly according to claim 1, wherein:
   the assembly includes three gradient coils fixed to the gradient coil former and the grid opposes elastic deformation of the gradient coil former induced by operation of any one or more of the gradient coils.

4. An MRI gradient coil assembly according to claim 1, wherein the gradient coil former, skin, and grid are cylindrical.

5. An MRI gradient coil assembly according to claim 4, wherein the cylindrical grid is affixed to an interior surface of the cylindrical gradient coil former.

6. An MRI gradient coil assembly according to claim 4, wherein the cylindrical grid is fixed to an exterior surface of the cylindrical gradient coil former.

7. An MRI gradient coil assembly according to claim 1, wherein the gradient coil former and grid are planar.

8. An MRI gradient coil assembly according to claim 7, wherein the planar grid is fixed to a surface of the planar gradient coil former.

9. An MRI gradient coil assembly according to claim 5, further including a cylindrical shield fixed to an interior surface of the cylindrical grid.

10. An MRI gradient coil assembly according to claim 7, further including a planar shield fixed to a surface of the grid closest to the imaging area and the gradient coil fixed to a distal surface of the grid further from the imaging area.

11. An MRI gradient coil assembly according to claim 2, wherein the geometric shapes are equilateral triangles.

12. An MRI gradient coil assembly according to claim 1, wherein the grid is integral with the gradient coil former.

13. An MRI gradient coil assembly according to claim 1, wherein the grid is integral with the skin.

14. An MRI gradient coil assembly according to claim 12, wherein the ribs form a web of geometric shapes.

15. An MRI gradient coil assembly according to claim 12, wherein the assembly includes three gradient coils embedded within the gradient coil former and the grid opposes elastic deformation of the gradient coil former induced by operation of any one or more of the gradient coils.

16. An MRI gradient coil assembly according to claim 12, wherein, the gradient coil former and grid are cylindrical.

17. An MRI gradient coil assembly according to claim 12, wherein the gradient coil former and grid are planar.

18. An MRI gradient coil assembly according to claim 17, wherein the planar grid is fixed to a surface of the planar gradient coil former.

19. An MRI gradient coil assembly according to claim 16, further including a cylindrical shield fixed to the cylindrical grid.

20. An MRI gradient coil assembly according to claim 17, further including a planar shield attached to the grid.

21. An MRI gradient coil assembly according to claim 14, wherein the geometric shapes are equilateral triangles.

22. An MRI gradient coil assembly according to claim 12, further including a skin fixed to the plurality of interconnected ribs.

23. An MRI gradient coil assembly according to claim 16, further including a skin fixed to an interior surface of the cylindrical grid.

24. An MRI gradient coil assembly according to claim 18, further including a skin fixed to the planar grid opposite the gradient coil former.

25. An MRI gradient coil assembly, comprising:
   at least one gradient coil to induce a gradient magnetic field in an imaging area;
   a cylindrical gradient coil former fixed to the gradient coil; and
   a cylindrical grid fixed to an exterior surface of the gradient coil former, the grid having a plurality of interconnected ribs forming a web wherein the grid opposes elastic deformation of the gradient coil former induced by operation of the gradient coil.

26. An MRI gradient coil assembly according to claim 25, wherein the ribs form a web of geometric shapes.

27. An MRI gradient coil assembly according to claim 25, wherein:
   the assembly includes three gradient coils fixed to the gradient coil former and the grid opposes elastic deformation of the gradient coil former induced by operation of any one or more of the gradient coils.

28. An MRI gradient coil assembly according to claim 26, wherein the geometric shapes are equilateral triangles.

29. An MRI gradient coil assembly, comprising:
   at least one gradient coil to induce a gradient magnetic field in an imaging area;
   a planar gradient coil former fixed to the gradient coil; and
   a planar grid fixed to the gradient coil former, the grid having a plurality of interconnected ribs forming a web wherein the grid opposes elastic deformation of the gradient coil former induced by operation of the gradient coil.

30. An MRI gradient coil assembly according to claim 29, wherein the ribs form a web of geometric shapes.

31. An MRI gradient coil assembly according to claim 29, wherein:
   the assembly includes three gradient coils fixed to the gradient coil former and the grid opposes elastic deformation of the gradient coil former induced by operation of any one or more of the gradient coils.

32. An MRI gradient coil assembly according to claim 30, wherein the geometric shapes are equilateral triangles.

33. An MRI gradient coil assembly to claim 29, wherein the planar grid is fixed to a surface of the planar gradient coil former.

34. An MRI gradient coil assembly according to claim 29, further including a planar shield fixed to a surface of the grid closest to the imaging area and the gradient coil fixed to a distal surface of the grid further from the imaging area.

35. An MRI gradient coil assembly, comprising:
   at least one gradient coil to induce a gradient magnetic field in an imaging area;
   a gradient coil former fixed to the gradient coil; and
   a grid fixed to the gradient coil former, the grid having a plurality of interconnected ribs forming a web of equilateral triangles wherein the grid opposes elastic deformation of the gradient coil former induced by operation of the gradient coil.

36. An MRI gradient coil assembly, comprising: p1 three gradient coils to induce a gradient magnetic field in an imaging area;
   a gradient coil former, the gradient coils embedded within the gradient coil former; and
   a grid integral with the gradient coil former, the grid having a plurality of interconnected ribs forming a web wherein the grid opposes elastic deformation of the gradient coil former induced by operation of one or more of the gradient coils.

37. An MRI gradient coil assembly according to claim 36, wherein the ribs form a web of geometric shapes.

38. An MRI gradient coil assembly according to claim 36, wherein:
   the assembly includes three gradient coils embedded within the gradient coil former and the grid opposes elastic deformation of the gradient coil former induced by operation of any one or more of the gradient coils.

39. An MRI gradient coil assembly according to claim 36, wherein the gradient coil former and grid are cylindrical.

40. An MRI gradient coil assembly according to claim 39, wherein the cylindrical grid is at an interior surface of the cylindrical gradient coil former.

41. An MRI gradient coil assembly according to claim 39, wherein the cylindrical grid is at an exterior surface of the cylindrical gradient coil former.

42. An MRI gradient coil assembly according to claim 36, wherein the gradient coil former and grid are planar.

43. An MRI gradient coil assembly according to claim 40, further including a cylindrical shield fixed to an interior surface of the cylindrical grid.

44. An MRI gradient coil assembly according to claim 42, further including a planar shield fixed to a surface of the grid closest to the imaging area and the gradient coil fixed to a distal surface of the grid further from the imaging area.

45. An MRI gradient coil assembly according to claim 37, wherein the geometric shapes are equilateral triangles.

* * * * *